(12) United States Patent
Ose

(10) Patent No.: US 9,312,854 B2
(45) Date of Patent: Apr. 12, 2016

(54) CIRCUIT FOR SWITCHING-ON AND/OR SWITCHING-OFF AN ELECTRICAL LOAD

(75) Inventor: Lutz Ose, Sternenfels (DE)

(73) Assignee: E.G.O. ELEKTRO-GERÄTEBAU GMBH, Oberderdingen (DE)

( * ) Notice: Subject to any disclaimer, the term of this patent is extended or adjusted under 35 U.S.C. 154(b) by 787 days.

(21) Appl. No.: 13/270,713

(22) Filed: Oct. 11, 2011

(65) Prior Publication Data
US 2012/0091825 A1      Apr. 19, 2012

(30) Foreign Application Priority Data

Oct. 13, 2010 (DE) .......................... 10 2010 042 428

(51) Int. Cl.
*H03H 3/00* (2006.01)
*H03K 17/96* (2006.01)
*H03K 17/78* (2006.01)

(52) U.S. Cl.
CPC .............. *H03K 17/962* (2013.01); *H03K 17/78* (2013.01); *H03K 2217/0036* (2013.01); *Y10T 307/937* (2015.04)

(58) Field of Classification Search
CPC ............... H01H 3/00; H01H 3/14; G02B 6/00
USPC ......................................................... 307/139
See application file for complete search history.

(56) References Cited

U.S. PATENT DOCUMENTS

| | | | | | |
|---|---|---|---|---|---|
| 4,129,785 | A | * | 12/1978 | Kadah ................... | H03K 17/79 250/551 |
| 4,493,377 | A | * | 1/1985 | Gunther ................... | F16P 3/20 173/170 |
| 5,251,093 | A | * | 10/1993 | Dickey ................... | H01H 47/02 361/160 |
| 5,283,429 | A | * | 2/1994 | Campolo ............... | G01K 11/32 250/227.14 |

(Continued)

FOREIGN PATENT DOCUMENTS

| | | |
|---|---|---|
| DE | 12 97 183 B | 6/1969 |
| DE | 21 40 276 A1 | 2/1972 |

(Continued)

OTHER PUBLICATIONS

German Office Action dated Jun. 21, 2011 in German Application No. 10 2010 042 428.5.
European Search Report dated Jan. 13, 2012 in EP 11 18 4692.
Japanese Examination Report from JP Patent Application No. 2011-225397 dated Apr. 27, 2015; 2 pages.

*Primary Examiner* — Thienvu Tran
*Assistant Examiner* — Joseph Inge
(74) *Attorney, Agent, or Firm* — Lee & Hayes, PLLC

(57) ABSTRACT

A circuit for switching-on and/or switching-off an electrical load comprises an electrically conductive operator control element, an electrically operated lighting element that is looped-in between the operator control element and a live pole of an AC voltage source in such a way that current flows through the lighting element, as a result of which the lighting element emits light, when the operator control element is operated, an opto-electrical transducer is optically coupled to the lighting element, is shielded from ambient light and converts light emitted by the lighting element into electrical energy, and a switch that is electrically coupled to the opto-electrical transducer and connects the electrical load to a supply voltage (UV) or disconnects the electrical load from the said supply voltage, with the switch connecting the electrical load to the supply voltage when it is supplied with electrical energy by the opto-electrical transducer.

13 Claims, 2 Drawing Sheets

(56) References Cited

U.S. PATENT DOCUMENTS

| | | | | |
|---|---|---|---|---|
| 5,291,014 A | * | 3/1994 | Brede | B60R 21/01 250/227.21 |
| 5,426,667 A | * | 6/1995 | van Zon | G06K 7/0008 375/219 |
| 2003/0127914 A1 | * | 7/2003 | Homan | F24F 7/007 307/112 |
| 2006/0146456 A1 | * | 7/2006 | Williams | H01H 83/02 361/42 |
| 2011/0090604 A1 | * | 4/2011 | Butler | H03F 1/52 361/18 |

FOREIGN PATENT DOCUMENTS

| | | |
|---|---|---|
| DE | 14 90 456 B | 4/1986 |
| EP | 0 243 317 A2 | 10/1987 |
| EP | 0 347 471 A1 | 12/1989 |
| JP | 57109230 | 7/1982 |
| JP | 2008010972 | 1/2008 |

* cited by examiner

CIRCUIT FOR SWITCHING-ON AND/OR SWITCHING-OFF AN ELECTRICAL LOAD

CROSS REFERENCE TO RELATED APPLICATIONS

This application claims priority to German patent application DE 10 2010 042 428.5, filed on Oct. 13, 2010, the contents of which are incorporated by reference for all that it teaches.

FIELD OF APPLICATION

The invention pertains to a circuit for switching-on and/or switching-off an electrical load.

BACKGROUND

In electrical loads, for example television sets, domestic appliances etc., which can be switched to a standby operating state, it is desirable to minimize or completely eliminate power consumption in the standby operating state.

Mechanical switching contacts which completely disconnect the electrical load from its supply voltage in the standby operating state or in the off-state are generally required in order to completely eliminate power consumption in the standby operating state. The electrical load is generally switched on again by mechanical operation of an operator control element that is associated with the mechanical switching contact, as a result of which, the mechanical switching contact is closed and the electrical load is connected to its supply voltage. In other words, a mechanically operable operator control element is required for the switch-on operation.

SUMMARY

The invention addresses the problem of providing a circuit for switching-on and/or switching-off an electrical load, by means of which circuit power consumption in the standby operating state or in the off-state can be completely eliminated and a mechanically operable operator control element is not required to switch on and/or switch off the electrical load.

Preferred embodiments are the subject matter of the dependent claims, the wording of the said dependent claims hereby being incorporated in the description by way of reference.

In one embodiment, the circuit for switching-on and/or switching-off an electrical load comprises: an electrically conductive, flat, operator control element, for example in the form of an electrically conductive, flat electrode, as used, for example, as a so-called capacitive touch-operated key, an electrically operated lighting element which is looped-in (without or with further interposed elements) between the operator control element and a live pole of a (mains) AC voltage source in such a way that current flows through the lighting element when the operator control element is operated by a user, with an electrical circuit being closed by the user. As a result, the lighting element emits light and an opto-electrical transducer which is optically coupled to the lighting element is shielded from ambient light and converts light that is emitted by the lighting element into electrical energy, and a switch which is directly or indirectly electrically coupled to the opto-electrical transducer and connects the electrical load to a supply voltage or disconnects the electrical load from the said supply voltage, with the switch connecting the electrical load to the supply voltage when it is supplied with electrical energy by the opto-electrical transducer. During a switch on interval, i.e., when the circuit is transferred from a non-energized state to an energized state, said switching element is preferably exclusively supplied with said electrical energy by the opto-electrical transducer. If the switch is not supplied with electrical energy either by the opto-electrical transducer or by further energy sources, the switch can be designed in such a way that it disconnects the electrical load from the supply voltage in this case. At the same time, the AC voltage source can deliver or form the supply voltage for the electrical load, i.e., the supply voltage and the AC voltage that is delivered by the AC voltage source can be identical.

In another embodiment, the operator control element is an electrically conductive, planar, contact area. The operator control element may be, for example, a metallized area with an area of approximately 1 $cm^2$.

In another embodiment, the operator control element has a first conductive contact section that is electrically coupled to the lighting element, and a second conductive contact section is spaced apart and electrically insulated from the first conductive section and that is electrically coupled to a reference potential of the AC voltage source, with the first and the second contact section being connected to one another by means of a user when the user touches the operator control element. The AC voltage source preferably has an earth or ground potential as the reference potential.

In another embodiment, the electrically operated lighting element is a glow lamp or a gas discharge tube.

In another embodiment described herein, a high-value series resistor is provided for limiting a current which flows through the user, with the electrically operated lighting element and the series resistor being looped-in in series between the operator control element and the live pole of the AC voltage source. A resistance value of the series resistor can be, for example, approximately 1 M$\Omega$.

In another embodiment described herein, the switch is a relay, with the relay coil being supplied with energy by means of the opto-electrical transducer when the operator control element is operated, with the working contacts of the relay connecting the electrical load to the supply voltage in this case.

As an alternative, the switch can be a semiconductor switch, with a control input of the semiconductor switch being supplied with energy by means of the opto-electrical transducer when the operator control element is operated, with the semiconductor switch connecting the electrical load to the supply voltage in this embodiment.

In an embodiment described herein, a self-latching circuit is provided, this being designed to continue to apply the supply voltage to the electrical load after operation of the operator control element after the supply voltage has been applied to the said electrical load for the first time. This can ensure that the electrical load continues to be connected to the supply voltage even after the operator control element has been operated. The self-latching circuit is preferably designed to actuate the switch in such a way that the said switch maintains its switching state after the electrical load has been connected to the supply voltage for the first time.

In another embodiment described herein, an amplifier circuit is provided, this being looped-in between the opto-electrical transducer and the switch and being designed to generate an actuation signal, which is suitable for actuating the switch from the electrical energy provided by the opto-electrical transducer.

BRIEF DESCRIPTION OF THE DRAWINGS

Advantageous embodiments of the invention will be described below and are schematically illustrated in the drawings, in which.

DETAILED DESCRIPTION

Figure 1:
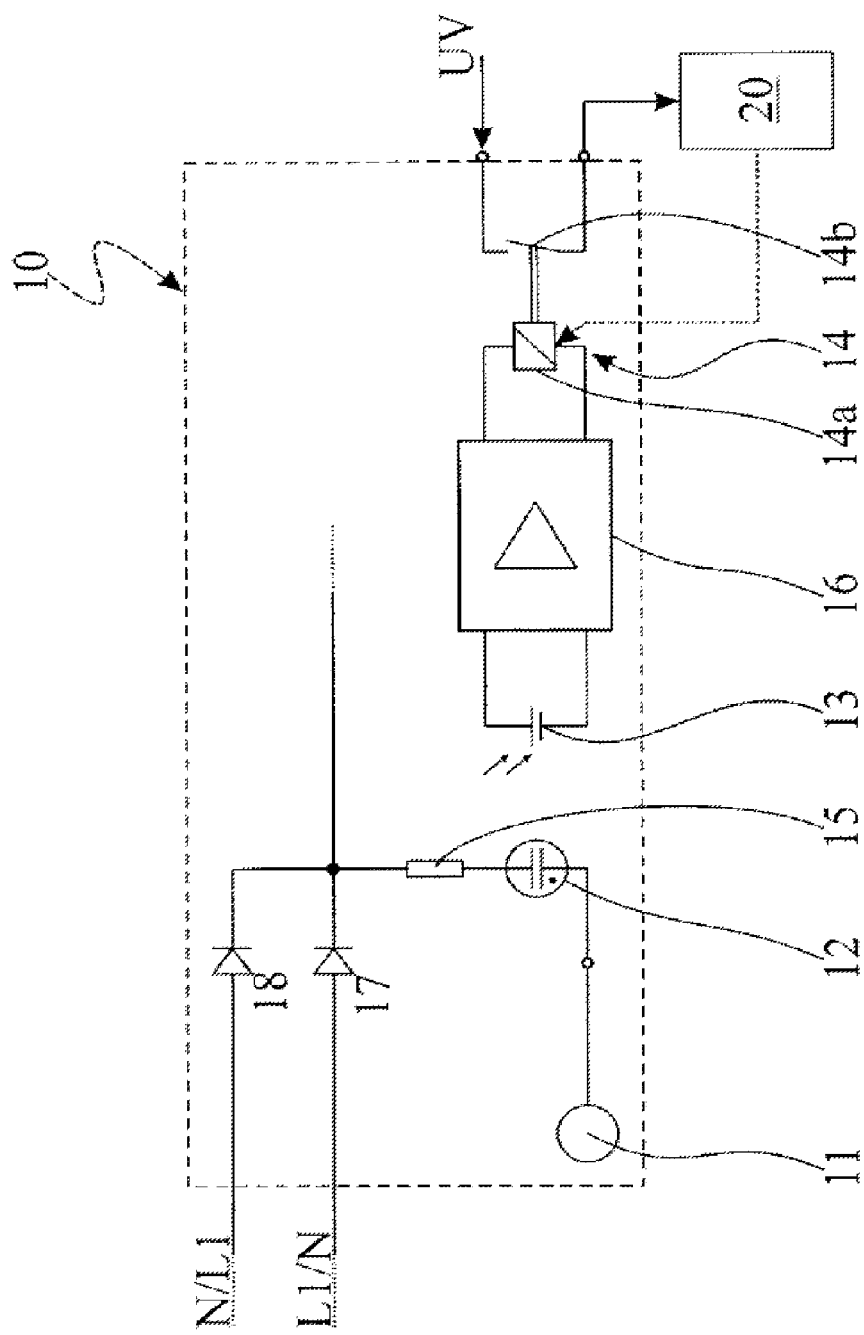
FIG. 1 shows a block diagram of a portion of a domestic appliance having an electrical load and a circuit for switching-on and/or switching-off the electrical load.

FIG. 1 schematically shows a block diagram of a portion of a domestic appliance, for example an electric cooker, having an electrical load 20, for example in the form of a domestic appliance controller, and a circuit 10 for switching-on and/or switching-off the electrical load 20.

The circuit 10 comprises an operator control element, which can be operated by a user (not illustrated), for example using a finger, in the form of an electrically conductive contact area 11, an electrically operated lighting element in the form of a glow lamp 12 which is looped-in between the operator control element 11 and a live pole L1 of a conventional mains AC voltage source together with a high-value series resistor 15, an opto-electrical transducer in the form of a solar cell 13 which is optically coupled to the glow lamp 12, is shielded from ambient light and converts light which is emitted by the glow lamp 12 into electrical energy, and a switch in the form of a relay 14, with an amplifier circuit 16 being looped-in between the solar cell 13 and the relay 14.

Optional diodes 17 and 18 are provided for the purpose of preventing polarity reversal, these diodes being looped-in between the live pole L1 of the mains AC voltage source or a neutral conductor N of the mains AC voltage source and the series resistor 15. If the diodes 17 and 18 are dispensed with, care should be taken that the series resistor 15 is connected to the live pole L1 of the mains AC voltage source and not to the neutral conductor N.

The relay 14 is electrically coupled to the solar cell 13 by means of the amplifier circuit 16 and connects the electrical load 20 to a supply voltage UV when it is supplied with electrical energy by the solar cell 13 or the amplifier circuit 16.

The amplifier circuit 16 serves to generate an actuation signal which is suitable for actuating the relay 14, or a suitable voltage, from the electrical energy or voltage which is provided by the solar cell 13, that is to say to supply power to a relay coil 14a of the relay 14 in such a way that a switching contact 14b of the relay is closed, in order to connect the electrical load 20 to the supply voltage UV.

An electrical circuit is connected to ground potential by means of a user when the operator control element 11 is operated by the user, and therefore current flows through the glow lamp 12, as a result of which light is emitted. Consequently, the relay coil 14a is suitably supplied with power, and therefore the electrical load 20 is connected to the supply voltage UV.

After operation of the operator control element 11, a self-latching circuit (not illustrated in detail) in the electrical load 20 causes power to be supplied to the relay coil 14a, independently of operation of the operator control element 11, in such a way that the relay 14 maintains its switching state, that is to say the supply voltage UV continues to be applied to the electrical load 20. In order to switch off the domestic appliance or to switch the domestic appliance to a standby operating state or off-state, the self-latching circuit terminates the supply of power to the relay coil 14a, as a result of which the electrical load 20 is disconnected from the supply voltage UV. Consequently, power consumption in the standby operating state or in the off-state can be completely eliminated.

As an alternative, the self-latching circuit can also comprise a further relay (not illustrated) which is actuated by the electrical load 20, the switching contact of the said further relay being connected in parallel with the switching contact 14b of the relay 14. If the electrical load 20 actuates this relay in such a way that the switching contact of the said relay closes, it is possible to ensure that the electrical load 20 continues to be connected to the supply voltage UV even when the switching contact 14b is opened after operation.

The operating state of the operator control element 11 can additionally be detected in the electrical load 20 in order to provide the operator control element 11 with further functions. Further, conventional elements (not shown) may be provided for this purpose. For example, the operator control element 11 can also be used to switch off the electrical load 20 in a manner triggered by software.

Figure 2:
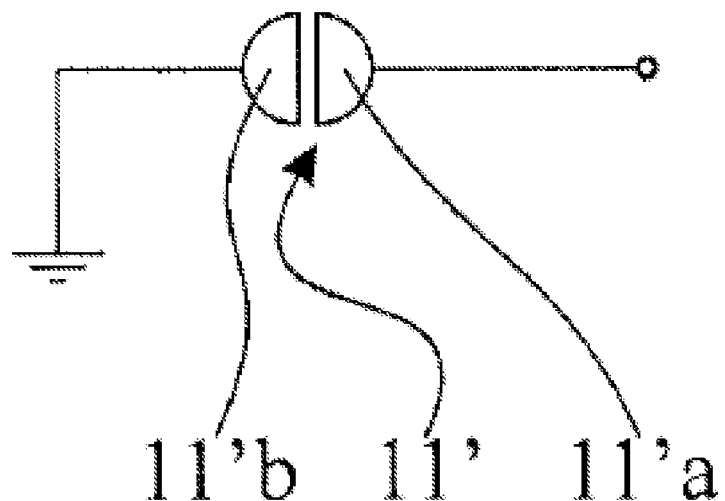
FIG. 2 shows an embodiment of an operator control element.

FIG. 2 shows a further embodiment of an operator control element 11' which has a first conductive, flat contact section 11'a which is electrically coupled to the glow lamp 12, and a second conductive contact section 11'b which is spaced apart and electrically insulated from the first conductive section 11'a and is electrically coupled to earth potential, with the first and the second contact section being connected to one another by means of a user when the user touches the operator control element 11'. An operator control element of this kind is advantageous, for example, when there is a poor connection to ground, in particular, in the case of highly electrically insulating floors.

The embodiments according to the invention combine the advantages of operator control by means of so-called touch-operated keys, which do not require mechanical operation, with a mechanical relay contact which ensures substantial avoidance of standby energy losses.

The operator control element in the form of a touch-operated control key or an electrode 11 or 11' with which contact can be made functions as a main switch for a downstream appliance control assembly 20. An operator touches the said main switch with a finger for the purpose of switch-off or switch-on operation (implement the standby state or readiness state of the controller 20). A glow lamp 12 having a series resistor 15 is arranged downstream of the electrode. The end of this series circuit is connected to the live conductor L1 of the earthed power supply system. In this respect, this portion of the arrangement corresponds to a commercially available voltage tester.

The light from the glow lamp 12 strikes an opaquely optically coupled solar cell 13 and generates an electrical DC voltage there when a finger touches the electrode 11. The said DC voltage, possibly conditioned by means of a voltage amplifier 16 or similar circuit arrangements, is used to switch on the relay 14. The glow lamp 12 and the solar cell 13 form an optocoupler. The glow lamp 12 and the operator control element 11 operate in accordance with the voltage tester principle when a finger makes contact. The energy from the solar cell switches on the relay 14. The controller 20 has a self-latching function for its supply voltage UV.

Those skilled in the art will recognize that instead of the glow lamp 12, comparable lighting means, for example LEDs etc., can also be used.

Those skilled in the art will recognize that any desired opto-electrical transducers can be used instead of the solar cell 13.

A suitable semiconductor switch, for example an IGBT etc., can likewise be used as the switch instead of the relay 14, with a control input of the semiconductor switch being supplied with energy by means of the opto-electrical transducer when the operator control element 11 is operated, as a result of which the semiconductor switch connects the electrical load 20 to its supply voltage.

The circuit can also be implemented as an intermediate adapter which can be plugged into a conventional plug socket, it being possible for a mains plug of the electrical load to be plugged into an associated socket of the intermediate adapter.

In order to ensure that polarity reversal is prevented in the case of a domestic appliance with a conventional mains plug, a suitable indicator can be provided in the domestic appliance as an alternative to the diodes 17 and 18, the indicator indicating whether the mains plug is correctly plugged into a plug socket. The diodes 17 and 18 can be dispensed with in this case.

The invention claimed is:

1. A circuit for one of switching-on or switching-off an electrical load, comprising:
    a single electrically conductive operator control element;
    an electrically operated lighting element that is looped-in between the single operator control element and a live pole of an AC voltage source in such a way that current flows through the lighting element, as a result of which the lighting element emits light when the single operator control element is operated;
    an opto-electrical transducer configured to be optically coupled to the lighting element, to be shielded from ambient light, and to convert light emitted by the lighting element into electrical energy; and
    a switch configured to be electrically coupled to the opto-electrical transducer, and to one of connect the electrical load to a supply voltage or disconnect the electrical load from the said supply voltage, the switch including a switching contact operable by the switch for connecting the electrical load to the supply voltage during a switch-on interval when the switch is exclusively supplied with said electrical energy by the opto-electrical transducer, wherein the switch is one of
        a relay having a relay coil being supplied with said energy by the opto-electrical transducer when the single operator control element is operated, or
        a semiconductor switching element, with a control input of the semiconductor switching element supplied with said energy by the opto-electrical transducer when the single operator control element is operated.

2. The circuit according to claim 1, wherein the single operator control element is an electrically conductive contact area.

3. The circuit according to claim 1, wherein the single operator control element comprises:
    a first conductive contact section electrically coupled to the lighting element; and
    a second conductive contact section which is spaced apart and electrically insulated from the first conductive contact section and is electrically coupled to a reference potential of the AC voltage source, with the first and the second contact section being connected to one another when a user touches the single operator control element.

4. The circuit according to claim 1, wherein the AC voltage source has a ground potential as the reference potential.

5. The circuit according to claim 1, wherein the electrically operated lighting element is a glow lamp.

6. The circuit according to claim 1, wherein the electrically operated lighting element and a series resistor are looped-in in series between the single operator control element and the live pole of the AC voltage source.

7. The circuit according to claim 1, wherein a self-latching circuit is configured to continue to connect the electrical load to the supply voltage after the said electrical load has been connected to the supply voltage during said switch-on interval.

8. The circuit according to claim 7, wherein the self-latching circuit is designed to actuate the switch in such a way that the switch maintains its switching state after the electrical load has been connected to the supply voltage during said switch-on interval.

9. The circuit according to claim 1, further comprising:
    an amplifier circuit looped-in between the opto-electrical transducer and the switch and is configured to generate an actuation signal suitable for actuating the switch, from the electrical energy provided by the opto-electrical transducer.

10. A circuit for one of switching-on or switching-off an electrical load, comprising:
    a single electrically conductive operator control element;
    an electrically operated lighting element that is looped-in between the single operator control element and a live pole of an AC voltage source in such a way that current flows through the lighting element, as a result of which the lighting element emits light when the single operator control element is operated;
    an opto-electrical transducer configured to be optically coupled to the lighting element, to be shielded from ambient light, and to convert light emitted by the lighting element into electrical energy; and
    a switch configured to be electrically coupled to the opto-electrical transducer, and to one of connect the electrical load to a supply voltage or disconnect the electrical load from the said supply voltage, the switch including a switching contact operable by the switch for connecting the electrical load to the supply voltage during a switch-on interval when the switch is exclusively supplied with said electrical energy by the opto-electrical transducer, wherein the switch is one of
        a relay having a relay coil being supplied with said energy by the opto-electrical transducer when the single operator control element is operated, or
        a semiconductor switching element, with a control input of the semiconductor switching element supplied with said energy by the opto-electrical transducer when the single operator control element is operated.

11. A circuit for switching-on an electrical load, comprising:
    a single electrically conductive operator control element;
    an electrically operated lighting element that is looped-in between the single operator control element and a live pole of an AC voltage source in such a way that current flows through the lighting element, as a result of which the lighting element emits light when the single operator control element is operated;
    an opto-electrical transducer configured to be optically coupled to the lighting element, to be shielded from ambient light, and to convert light emitted by the lighting element into electrical energy;
    a switch configured to be electrically coupled to the opto-electrical transducer, and to one of connect the electrical load to a supply voltage or disconnect the electrical load from the said supply voltage, the switch including a switching contact operable by the switch for connecting the electrical load to the supply voltage during a switch-on interval when the switch is exclusively supplied with said electrical energy by the opto-electrical transducer, the switch power consumption being completely eliminated in a standby operating state and in an off-state; and a self-latching circuit configured to maintain the connection between the electrical load and the supply voltage independent of operation of the single electrically conductive operator control element after the said electrical load has been connected to the supply voltage during said switch-on interval, wherein the switch is one of a relay having a relay coil being supplied with said energy by the opto-electrical transducer when the single operator control element is operated, or a semiconductor switching element, with a control input of the semiconductor switching element supplied with said energy by the opto-electrical transducer when the single operator control element is operated.

12. The circuit according to claim 11, wherein the electrical load comprises the self-latching circuit.

13. The circuit according to claim 11, wherein the self-latching circuit terminates the supply of power by the opto-electrical transducer to the switch to disconnect the electrical load from the supply voltage.

* * * * *